US011835679B2

United States Patent
Konishi et al.

(10) Patent No.: US 11,835,679 B2
(45) Date of Patent: Dec. 5, 2023

(54) POWDER FOR FORMING BLACK LIGHT-SHIELDING FILM AND METHOD FOR MANUFACTURING SAME

(71) Applicant: MITSUBISHI MATERIALS ELECTRONIC CHEMICALS CO., LTD., Akita (JP)

(72) Inventors: Takashi Konishi, Akita (JP); Kensuke Kageyama, Akita (JP)

(73) Assignee: MITSUBISHI MATERIALS ELECTRONIC CHEMICALS CO., LTD., Akita (JP)

(*) Notice: Subject to any disclaimer, the term of this patent is extended or adjusted under 35 U.S.C. 154(b) by 426 days.

(21) Appl. No.: 16/957,197

(22) PCT Filed: Oct. 25, 2018

(86) PCT No.: PCT/JP2018/039664
§ 371 (c)(1),
(2) Date: Jun. 23, 2020

(87) PCT Pub. No.: WO2019/130772
PCT Pub. Date: Jul. 4, 2019

(65) Prior Publication Data
US 2020/0319373 A1    Oct. 8, 2020

(30) Foreign Application Priority Data

Dec. 26, 2017 (JP) ................. 2017-248647

(51) Int. Cl.
| | | |
|---|---|---|
| *G02B 1/00* | (2006.01) | |
| *B22F 9/22* | (2006.01) | |
| *C01B 21/076* | (2006.01) | |
| *G03F 7/004* | (2006.01) | |
| *C22C 32/00* | (2006.01) | |
| *G02B 1/10* | (2015.01) | |
| *G02B 5/00* | (2006.01) | |

(52) U.S. Cl.
CPC .............. *G02B 1/00* (2013.01); *B22F 9/22* (2013.01); *C01B 21/076* (2013.01); *C22C 32/0005* (2013.01); *G03F 7/0042* (2013.01); *G03F 7/0045* (2013.01); *B22F 2201/016* (2013.01); *B22F 2201/02* (2013.01); *B22F 2201/10* (2013.01); *B22F 2302/20* (2013.01); *G02B 1/10* (2013.01); *G02B 5/003* (2013.01)

(58) Field of Classification Search
CPC ..... B22F 9/18–22; C01B 21/076–0768; G02B 1/00
See application file for complete search history.

(56) References Cited

U.S. PATENT DOCUMENTS

| | | | | |
|---|---|---|---|---|
| 2,461,019 | A | * | 2/1949 | Alexander ............ C01B 21/076 |
| | | | | 423/411 |
| 2008/0056977 | A1 | | 3/2008 | Hung et al. |
| 2021/0087404 | A1* | | 3/2021 | Watanabe ............ B82Y 40/00 |

FOREIGN PATENT DOCUMENTS

| | | | |
|---|---|---|---|
| CN | 1546370 | A | 11/2004 |
| CN | 101899230 | A | 12/2010 |
| CN | 103555003 | A | 2/2014 |
| CN | 104176716 | A | 12/2014 |
| JP | S60-186407 | A | 9/1985 |
| JP | H4-6102 | A | 1/1992 |
| JP | H-04006102 | A * | 1/1992 |
| JP | 2000-143985 | A | 5/2000 |
| JP | 2008-266045 | A | 11/2008 |
| JP | 2009-58946 | A | 3/2009 |
| JP | 2009-91205 | A | 4/2009 |
| JP | 2009091205 | A * | 4/2009 |
| JP | 2012-96945 | A | 5/2012 |
| JP | 4931011 | B2 | 5/2012 |
| JP | 2012-247518 | A | 12/2012 |
| JP | 2017-222559 | A | 12/2017 |
| JP | 2019104651 | A * | 6/2019 |
| WO | WO 2005/029180 | A1 | 3/2005 |
| WO | WO 2017/150093 | A1 | 9/2017 |

OTHER PUBLICATIONS

Office Action for JP App. No. 2017-248647, dated Aug. 10, 2021 (w/ translation).
EESR for EP App. No. 18895023.2, dated Sep. 13, 2021.
ISR for PCT/JP2018/039664, dated Dec. 4, 2018 (w/ translation).
Written Opinion for PCT/JP2018/039664, dated Dec. 4, 2018.
Office Action for CN App. No. 201880083877.8, dated Nov. 21, 2022 (w/ partial translation).
Notice of Allowance for CN App. No. 201880083877.8, dated Sep. 8, 2023 (w/ translation).

* cited by examiner

*Primary Examiner* — Alexandra M Moore
*Assistant Examiner* — Austin Pollock
(74) *Attorney, Agent, or Firm* — Greenblum & Bernstein, P.L.C.

(57) ABSTRACT

The present invention provides a powder for forming a black light-shielding film having a specific surface area of 20 to 90 m²/g, which is measured by the BET method, comprising zirconium nitride as a main component, and containing magnesium and/or aluminum. If containing the magnesium, the content of the magnesium is 0.01 to 1.0% by mass relative to 100% by mass of the powder for forming a black light-shielding film, and if containing the aluminum, the content of the aluminum is 0.01 to 1.0% by mass relative to 100% by mass of the powder for forming the black light-shielding film.

6 Claims, No Drawings

POWDER FOR FORMING BLACK LIGHT-SHIELDING FILM AND METHOD FOR MANUFACTURING SAME

TECHNICAL FIELD

The present invention relates to a powder for forming a black light-shielding film comprising zirconium nitride as a main component suitably used as an insulating black pigment and a manufacturing method therefor. More specifically, it relates to a powder for forming a black light-shielding film which can form a black light-shielding film excellent in ultraviolet transmittance and having a high-resolution patterning property as a black pigment and the formed black light-shielding film has a high light shielding property and high resistance to weather, and a manufacturing method therefor. This international application claims priority based on Japanese Patent Application No. 248647 (Japanese Patent Application No. 2017-248647) filed on Dec. 26, 2017, and the entire contents of Japanese Patent Application No. 2017-248647 are incorporated into this international application.

BACKGROUND ART

This type of black pigment is used for a black matrix of an image forming element such as a color filter of a liquid crystal display and the like, by dispersing in a photosensitive resin to prepare a black photosensitive composition, applying this composition to a substrate to form a photoresist film, and exposing the photoresist film by a photolithography method to form black light-shielding film having a patterning property (hereinafter referred to as a patterning film). Since carbon black as a conventional black pigment has conductivity, it is not suitable for applications requiring insulation properties.

Conventionally, as a black pigment with high insulating property, there is disclosed a high resistance black powder containing a black powder comprising titanium oxynitride which is also called as titanium black having a specific composition, and an insulating powder comprising at least one kind of $Y_2O_3$, $ZrO_2$, $Al_2O_3$, $SiO_2$, $TiO_2$ and $V_2O_5$ (for example, see Patent Document 1.). According to this black powder, it is said to be suitable as a black matrix of a color filter since it has a high resistance value and is excellent in light shielding property when it is formed into a black film.

Further, there in disclosed a black resin composition containing titanium nitride particles as a light-shielding material, and having a diffraction angle 2θ of 42.5° and more and 42.8° or less at a peak derived from the (200) phase of at least one type of titanium nitride particle when a CuKα line is used as an X-ray source and a crystalline size calculated from a half bandwidth of an X-ray diffraction peak derived from the (200) phase of 10 nm or more and 20 nm or nm or less (for example, see Patent Document 2). From this black resin composition, a resin black matrix having a high OD value and a high resistance value although having an achromatic color can be obtained, and it is supposed to provide a color filter which enables to display dense black when used for a liquid crystal display apparatus.

Further, there is disclosed a black powder shielding blue color which is a black powder characterized by consisting of one type or two types of oxynitrides of vanadium or niobium, having an oxygen content of 16% by weight and a nitride content of 10% by weight or more, and the ratio (X/Y) of transmittance X at 450 nm and transmittance at 550 nm is 2.0 or less, and/or the ratio (X/Z) of transmittance at 450 nm and transmittance at 650 nm is 1.5 or less (for example, see Patent Document 3). This black powder for shielding blue color has a high black color degree and an excellent light shielding property against blue color light and further preferably it is said to have a high insulating property.

Further, there is disclosed a fine particle lower zirconium oxide-zirconium nitride composite as an insulating black pigment containing zirconium nitride, characterized by having a peak corresponding to lower zirconium oxide and a peak corresponding to zirconium nitride in the X-ray diffraction profile, and having a specific surface area of 10 to 60 $m^2/g$ (for example, see Patent Document 4.). This fine particle lower zirconium oxide-zirconium nitride composite is produced by the process of firing a mixture of zirconium dioxide or zirconium hydroxide, magnesium oxide, and metallic magnesium at 650 to 800° C. in a nitrogen gas or an inert gas stream containing a nitrogen gas. The above-mentioned fine particle lower zirconium oxide-zirconium nitride composite can be used in a black system as a fine particle material having low electrical conductivity and it is said that it can be used as a fine particle black pigment having lower electrical conductivity of a black matrix for a display such as a television, etc., in which carbon black, etc., has been used, and according to the above-mentioned manufacturing method, it is said that the above-mentioned fine particle lower zirconium oxide-zirconium nitride composite can be (mass) produced on an industrial scale.

PRIOR ART DOCUMENTS

Patent Documents

Patent Document 1: JP 2008-266045A (Claim 1, paragraph [0002], paragraph [0010])
Patent Document 2: JP 2009-58946A (Abstract)
Patent Document 3: JP 2012-96945A (Claim 1, claim 2, paragraph [0008])
Patent Document 4: JP 2009-091205A (Claim 1, Claim 2, paragraph [0015], paragraph [0016])

SUMMARY OF THE INVENTION

Problems to be Solved by the Invention

However, the black powder called as titanium black shown in Patent Document 1, the black resin composition containing titanium nitride particle shown in Patent Document 2, the black powder consisting of oxynitride of vanadium or niobium shown in Patent Document 3, and the fine particle lower zirconium oxide-zirconium nitride composite shown in Patent Document 4 involved the problem that, when they are used as a black pigment, in order to obtain higher light shielding property, at the time of forming a black patterning film by increasing a pigment concentration to prepare a black photosensitive composition, applying the composition onto a substrate to form a photoresist film and exposing the photoresist film by a photolithography method, the black pigment in the photoresist film also shields an i line (wavelength: 365 nm) which is a ultraviolet ray, so that the ultraviolet ray does not reach the bottom portion of the photoresist film to cause an undercut at the bottom portion whereby a patterning film with high resolution cannot be formed.

Further, the fine particle lower zirconium oxide-zirconium nitride complex shown in Patent Document 4 had problems that resistance to oxidation deteriorates when a particle diameter decreases and a degree of black is lowered in a test of resistance to humidity and heating, namely resistance to weather is lowered.

An object of the present invention is to provide powder for forming a black light-shielding film which can form a black light-shielding film excellent in ultraviolet transmittance having a high resolution patterning property as a black pigment and the formed black light-shielding film has high light shielding property and high resistance to weather, and a manufacturing method thereof.

Means to Solve the Problems

The inventors have, focused on that if magnesium and/or aluminum is contained in a powder for forming a black light-shielding film comprising zirconium nitride as a main component, oxidized film layer or a nitride film layer with aluminum or magnesium is generated on an extreme surface layer of a nano-particulated zirconium nitride particle, and a black light-shielding film which has been formed using this powder as a black pigment displays high light-shielding property, in addition, high resistance to weather can be obtained, and have arrived at the present invention.

A first aspect of the present invention is a powder for forming a black light-shielding film having a specific surface area of 20 to 90 $m^2/g$, which is measured by the BET method, comprising a zirconium nitride powder as a main component, and containing magnesium and/or aluminum, characterized in that:

if containing the magnesium, the content of the magnesium is 0.01 to 1.0% by mass relative to 100% by mass of the powder for forming a black light-shielding film, and if containing the aluminum, the content of the aluminum is 0.01 to 1.0% by mass relative to 100% by mass of the powder for forming the black light-shielding film.

A second aspect of the present invention is a method for manufacturing powder for forming a black light-shielding film by mixing zirconium dioxide powder, metallic magnesium powder, magnesium oxide powder, and aluminum oxide powder or aluminum nitride powder so that the metallic magnesium is 25 to 150% by mass relative to 100% by mass of the zirconium dioxide, the magnesium oxide is 15 to 500% by mass relative to 100% by mass of the zirconium dioxide, and the aluminum oxide or the aluminum nitride is 0.02 to 5.0% by mass relative to 100% by mass of the zirconium dioxide, firing the obtained mixed power under an atmosphere of a sole nitrogen gas, under an atmosphere of a mixed gas of a nitrogen gas and a hydrogen gas, under an atmosphere of a mixed gas of a nitrogen gas and an ammonium gas, or under an atmosphere of a mixed gas of a nitrogen gas and an inert gas at a temperature of 650 to 900° C. to reduce the mixed powder.

A third aspect of the present invention is a black photosensitive composition which contains the powder for forming the black light-shielding film according to the first aspect or the powder for forming a black light-shielding film manufactured by the method according to the second aspect as a black pigment.

A fourth aspect of the present invention is a method for forming a black light-shielding film using the black photosensitive composition according to the third aspect.

Effects of the Invention

The powder for forming a black light-shielding film of the first aspect of the present invention has a specific surface area of 20 $m^2/g$ or more, it has an effect of suppressing segmentation when it is made to be a resist, and since it is 90 $m^2/g$ or less, it has an effect of having sufficient light-shielding property. By comprising zirconium nitride as a main competent, it has a characteristic of further transmitting ultraviolet rays more. As the result, a high resolution patterning film can be formed as a black pigment, in addition, the formed patterning film has a high light-shielding property. Further, by containing aluminum in an amount of 0.01 to 1.0% by mass, without lowering the light-shielding property of the black light-shielding film when a black light-shielding film is formed as a black pigment, enables to remarkably improve its resistance to weather. Furthermore, by containing magnesium with a ratio of 0.01 to 1.0% by mass, similarly it has an effect of improving its resistance to weather without lowering the light-shielding property of the above-mentioned black light shielding property.

In the manufacturing method of the powder for forming a black light-shielding film according to the second aspect of the present invention, by firing zirconium dioxide powder, metallic magnesium powder, magnesium oxide powder, and aluminum oxide powder or aluminum nitride powder with a predetermined ratio, a powder for forming a black light-shielding film containing 0.01 to 1.0% by mass of magnesium and 0.01 to 1.0% by mass of aluminum can be manufactured. Further, by firing under an atmosphere of a predetermined gas, the reduction reaction is promoted more and the reaction efficiency is heightened more, whereby the powder for forming a black light-shielding film comprising zirconium nitride as a main component can be manufactured even with a less amount of the metallic magnesium.

According to the black photosensitive composition of the third aspect of the present invention, the zirconium nitride powder is a main element as a black pigment, when a black patterning film is formed by using the composition, a patterning film with high resolution can be formed, and the formed patterning film becomes to have a high light shielding property, and further since aluminum is contained in the zirconium nitride powder, the formed patterning film becomes to have high resistance to weather.

According to the forming method of the black light-shielding film which is the fourth aspect of the present invention, a black light-shielding film with a high resolution patterning characteristic can be formed, and the formed black light-shielding film becomes to have a high light shielding property and high resistance to weather.

EMBODIMENTS TO CARRY OUT THE INVENTION

Next, embodiments to carry out the present invention will be explained.

[Method for Manufacturing Powder for Forming Black Light-Shielding Film by Firing $ZrO_2$, Metal Mg, MgO and $Al_2O_3$]

In this embodiment, powder for forming a black light-shielding film comprising zirconium nitride as a main element is manufactured by using each powder of zirconium dioxide ($ZrO_2$), metallic magnesium (metal Mg), magnesium oxide (MgO) and aluminum oxide ($Al_2O_3$) as raw materials, and by firing under a specific atmosphere at a predetermined temperature and time. Aluminum nitride (AlN) powder can be used instead of aluminum oxide powder.

[Zirconium Dioxide Powder]

As the zirconium dioxide powder of the present embodiment, for example, any of the powders of the zirconium dioxide such as monoclinic zirconium dioxide, cubic zirconium dioxide, yttrium stabilized zirconium dioxide or the like can be used, and from the viewpoint of increasing the production rate of the zirconium nitride powder, monoclinic zirconium dioxide powder is preferred.

[Metallic Magnesium Powder]

If the particle diameter of the metallic magnesium powder is too small, the reaction proceeds rapidly and the risk of operation becomes high, so it is preferable that the material has the particle diameter of 100 to 1,000 μm in a mesh pass of a sieve and in a granular state, and particularly preferably the material having 100 to 500 μm in a granular state. Provided that even if all the metallic magnesium is not within the above-mentioned range of the particle diameter, it may be sufficient if 80% by mass or more, in particular, 90% by mass or more thereof is within the above-mentioned range.

The amount of the metallic magnesium powder added to the zirconium dioxide powder affects the reducing power of the zirconium dioxide. If the amount of the metallic magnesium is too little, it is difficult to obtain the intended zirconium nitride powder due to insufficient reduction, while if it is too much, the reaction temperature rapidly rises due to excessive metallic magnesium and there is a fear of causing grain growth of the powder which will become uneconomical. In the metallic magnesium powder, depending on the size of the particle diameter thereof, the metallic magnesium powder is added to the zirconium dioxide powder so that the metallic magnesium becomes the ratio of 25 to 150% by mass relative to 100% by mass of the zirconium dioxide and mixed. If it is less than 25% by mass, the reducing power of the zirconium dioxide is insufficient, while if it exceeds 150% by mass, the reaction temperature rapidly rises due to excessive metallic magnesium, and there is a possibility of causing grain growth of the powder and it becomes uneconomical. It is preferably 40 to 100% by mass.

[Magnesium Oxide Powder]

The magnesium oxide powder of the embodiment relaxes the reducing power of the metallic magnesium at the time of firing, and prevents sintering and grain growth of the zirconium nitride powder. The magnesium oxide powder is added, depending on the size of the particle diameter thereof, to zirconium dioxide so that the magnesium oxide becomes the ratio of 15 to 500% by mass relative to 100% by mass of the zirconium dioxide and mixed. If it is less than 15% by mass, sintering of the zirconium nitride powder will not be prevented, while if it exceeds 500% by mass, the amount of the acidic solution used required at the time of acid washing after firing increases, which is uneconomical. It is preferably 25 to 400% by mass. The magnesium oxide powder preferably has an average primary particle diameter of 1,000 nm or less in terms of a spherical shape from the measured value of the specific surface area, and is preferably 500 nm or less and 10 nm or more as the average primary particle diameter from the viewpoint of easiness in handling of the powder. It should be noted that not only magnesium oxide but also magnesium nitride is effective for preventing sintering of zirconium nitride, so it is possible to partially use magnesium nitride mixing with magnesium oxide. By the above-mentioned addition amount of metallic magnesium and magnesium oxide, the content by amount of magnesium in the powder for forming a black light-shielding film, which will be mentioned later, becomes 0.01 to 1.0% by mass.

[Aluminum Oxide Powder or Aluminum Nitride Powder]

The aluminum oxide powder of the embodiment, when a black light-shielding film is formed using powder for forming black light-shielding film containing this aluminum oxide powder, improves resistance to weather of this black light-shielding film. Further, it relaxes the reducing power of the metallic magnesium at the time of firing, and prevents sintering and grain growth of the zirconium nitride powder. The aluminum oxide powder is added, depending on the size of the particle diameter thereof, to zirconium dioxide so that the aluminum oxide becomes the ratio of 0.02 to 5.0% by mass relative to 100% by mass of the zirconium dioxide and mixed. If it is less than 0.02% by mass, the resistance to weather of the above-mentioned black light-shielding film does not improve, while if it exceeds 5.0% by mass, the light-shielding property of the above-mentioned black light-shielding film is lowered. It is preferably 0.05 to 1.0% by mass. The aluminum oxide powder preferably has an average primary particle diameter of 1,000 nm or less in terms of a spherical shape from the measured value of the specific surface area, and is preferably 500 nm or less and 10 nm or more as the average primary particle diameter from the viewpoint of easiness in handling of the powder. It should be noted that aluminum nitride powder also improves resistance to weather of the above-mentioned black light-shielding film when a black light-shielding film is formed using the powder for forming a black light-shielding film including this aluminum nitride powder as a black pigment, it is also possible to use aluminum nitride powder instead of aluminum oxide powder. The addition ratio of aluminum nitride powder is the same as that of aluminum oxide powder. By the above-mentioned addition amount of aluminum oxide powder or aluminum nitride powder, the content by amount of aluminum in the powder for forming a black light-shielding film, which will be mentioned later, becomes 0.01 to 1.0% by mass.

[Reduction Reaction by Metallic Magnesium Powder]

A temperature at the time of reduction reaction by metallic magnesium for generating the zirconium nitride powder of the present embodiment is 650 to 900° C., and preferably 700 to 800° C. 650° C. is the melting temperature of metallic magnesium, and if the temperature is lower than that, the reduction reaction of zirconium dioxide does not occur sufficiently. In addition, even if the temperature is made higher than 900° C., it is not preferable since its effect does not increase, heat energy is lost and firing of particles proceeds. Also, a time of reduction reaction is preferably 10 to 90 minutes, and more preferably 15 to 60 minutes.

A reaction vessel for carrying out the above-mentioned reduction reaction is preferably one having a lid so that raw materials and products are not scattered during the reaction. This is because, when the melting of metallic magnesium is started, the reduction reaction rapidly proceeds, the temperature rises accompanied thereby, the gas inside the vessel expands, and accordingly, there is a fear that the material inside of the vessel scatters to the outside.

[Atmospheric Gas at Reduction Reaction with Metallic Magnesium Powder]

The atmospheric gas at the time of the above-mentioned reduction reaction of the present embodiment is under an atmosphere of a nitrogen gas alone, under an atmosphere of a mixed gas of a nitrogen gas and a hydrogen gas, under an atmosphere of a mixed gas of a nitrogen gas and an ammonia gas or under an atmosphere of a mixed gas of a nitrogen gas and an inert gas. As the inert gas, there may be mentioned argon, helium, neon, krypton, xenon, etc. Among these, argon is most preferable. In the case of a mixed gas, during the above-mentioned reduction reaction, other than methods of using a nitrogen gas and a hydrogen gas in combination, using a nitrogen gas and an ammonia gas in combination or using a nitrogen gas and an inert gas in combination, it may be firstly subjected to reduction reaction in a hydrogen gas atmosphere, in an ammonia gas atmosphere or in an inert gas atmosphere followed by subjected to reduction reaction in an atmosphere of a nitrogen gas alone. The above-mentioned reduction reaction is carried out in the stream of the above-mentioned mixed gas. This mixed gas has a role of preventing contact between the metallic magnesium or a reduction product and oxygen, whereby preventing their oxidation, and reacting nitrogen with zirconium to generate zirconium nitride.

[Treatment of Reactant after Firing]

The reactant obtained by firing the mixture of the zirconium dioxide powder, the metallic magnesium powder, the magnesium oxide powder and the aluminum oxide powder or the aluminum nitride powder under the atmosphere of the above-mentioned mixed gas or under a nitrogen gas atmosphere, or under a hydrogen gas atmosphere, under an ammonia gas atmosphere or under an inert gas atmosphere followed by an atmosphere of a nitrogen gas alone is taken out from the reaction vessel, and, finally, after cooling to room temperature, washed with an acid solution such as an aqueous hydrochloric acid solution and the like to remove magnesium oxide generated by oxidation of the metallic magnesium or magnesium oxide, aluminum oxide or aluminum nitride contained from the beginning of the reaction for preventing sintering of the product. Here, by adjusting the washing time and the washing pH, the amount of the remaining magnesium can be adjusted to 0.01 to 1.0% by mass which is the range of the present invention. With regard to the acid washing, it is preferable to carry out at a pH of 0.5 or more, particularly at a pH of 0.7 or more, and a temperature of 90° C. or lower. This is because there is a fear of oxidizing zirconium nitride if the acidity is too strong or the temperature is too high. Then, after the acid washing, after adjusting the pH to 5 to 6 with aqueous ammonia or the like, the solid component is separated by filtration or centrifugal separation, and after drying the solid component, it is pulverized to obtain a powder for forming a black light-shielding film having zirconium nitride as a main component.

According to the amount of each of the metallic magnesium powder, the magnesium oxide power and the aluminum oxide powder or the aluminum oxide powder or the aluminum nitride powder to be added, magnesium and/or aluminum are contained in the finally obtained powder for forming a black light-shielding film. Namely, if each addition amount of the metallic magnesium powder and/or the magnesium oxide powder is more, magnesium is contained in the powder for forming a black light-shielding film in an amount of 0.01 to 1.0% by mass. On the other hand, if each addition amount of the metallic magnesium powder and/or the magnesium oxide powder is less, magnesium is not contained in the powder for forming a black light-shielding film. Similarly, if each addition amount of the aluminum oxide powder or the aluminum nitride powder is more, aluminum is contained in an amount of 0.01 to 1.0% by mass in the powder for forming a black light-shielding film. On the other hand, if the addition amount of the aluminum oxide film or the aluminum nitride film is less, aluminum is not contained in the powder for forming a black light-shielding film.

<Characteristics of Obtained Powder for Forming Black Light-Shielding Film>

The powders for forming a black light-shielding film obtained by the embodiment comprise zirconium nitride as a main component, and contains magnesium and aluminum.

Also, the powder for forming a black light-shielding film has a specific surface area measured by a BET value of 20 to 90 $m^2/g$. If the above-mentioned specific surface area of the powder for forming a black light-shielding film is less than 20 $m^2/g$, when it is made a black resist, a pigment is sedimented during a long term storage, while if it exceeds 90 $m^2/g$, when a patterning film is formed as a black pigment, the light shielding property is insufficient. It is more preferably 25 to 80 $m^2/g$. An average particle diameter regarded as spherical can be calculated from the above-mentioned specific surface area value by the following equation (1). The average particle diameter calculated from the BET specific surface area value is preferably 10 to 50 nm. In the equation (1), L is an average particle diameter (μm), ρ is a density of the powder (g/$cm^3$) and S is a specific surface area value ($m^2/g$) of the powder.

$$L=6/(\rho \times S) \tag{1}$$

When containing magnesium, the content of magnesium is 0.01 to 1.0% by mass, and preferably 0.05 to 0.5% by mass relative to 100% by mass of powder for forming a black light-shielding film, and when containing aluminum, the content of aluminum is 0.01 to 1% by mass, and preferably 0.05 to 0.5% by mass relative to 100% by mass of the powder for forming a black light-shielding film. If the content of magnesium is less than 0.01% by mass, the resistance to weather of the black light-shielding film, which is formed when the black light-shielding film is formed as a black pigment, cannot improve, while if it exceeds 1.0% by mass, the content of zirconium nitride decrease, and the light-shielding property is lowered. If the content of aluminum is less than 0.01% by mass, the resistance to weather of the black light-shielding film, which is formed as a black pigment when the black light-shielding film is formed, cannot improve, while if it exceeds 1.0% by mass, the light-shielding property is lowered.

[Forming Method of Patterning Film Using Powder for Forming Black Light-Shielding Film as Black Pigment]

A forming method of a patterning film represented by black matrix using the above-mentioned powder for forming a black light-shielding film as a black pigment will be described. First, the above-mentioned powder for forming a black light-shielding film is dispersed in a photosensitive resin to prepare a black photosensitive composition. Then, the black photosensitive composition is coated onto a substrate, and then, prebaking is carried out to evaporate the solvent to form a photoresist film. Next, the photoresist film is exposed to a prescribed pattern shape through a photomask, then, developed with an alkali developing solution to dissolve and remove the unexposed portion of the photoresist film, thereafter post-baking is preferably carried out whereby a predetermined black patterning film, i.e., a black light-shielding film is formed.

As an index representing a light shielding property (attenuation of transmittance) of the formed patterning film (the black light-shielding film), an optical density, i.e., an OD (Optical Density) value has been known. The patterning film formed by using the powder for forming a black light-shielding film of the present embodiment has a high OD value. Here, the OD value is a logarithmic representation of the degree of absorption of light as it passes through the patterning film, and is defined by the following equation (2). In the equation (2), I is a transmitted light quantity, and $I_0$ is an incident light quantity.

$$\text{OD value}=-\log_{10}(I/I_0) \tag{2}$$

As the above-mentioned substrate, for example, there may be mentioned glass, silicon, polycarbonate, polyester, aromatic polyamide, polyamideimide, polyimide, and the like. In addition, to the above-mentioned substrate, if desired, an appropriate pretreatment such as chemical treatment with a silane coupling agent, and the like, plasma treatment, ion plating, sputtering, gas phase reaction method, vacuum vapor deposition or the like may be optionally applied. When the black photosensitive composition is to be applied to a substrate, an appropriate coating method such as spin coating, cast coating, roll coating or the like can be adopted. A thickness of the coating is, as a thickness after drying, in general, 0.1 to 10 μm, preferably 0.2 to 7.0 μm, more preferably 0.5 to 6.0 μm. As the radiation used when the patterning film is formed, in the present embodiment, radiation having a wavelength in the range of 250 to 370 nm is preferable. An irradiation energy quantity of the radiation is preferably 10 to 10,000 J/m$^2$. Also, as the above-mentioned alkali developing solution, for example, an aqueous solution of sodium carbonate, sodium hydroxide, potassium hydroxide, tetramethylammonium hydroxide, choline, 1,8-diazabicyclo-[5.4.0]-7-undecene, 1,5-diazabicyclo-[4.3.0]-5-nonene, and the like are preferable. To the above-mentioned alkali developing solution, for example, a suitable amount of a water-soluble organic solvent such as methanol, ethanol or the like, or a surfactant or the like may be added. Incidentally, after alkali development, it is usually washed with water. As the developing treatment method, a shower development method, a spray development method, a dipping (immersion) development method, a puddle (liquid filling) development method and the like can be applied, and the development condition is preferably for 5 to 300 seconds at normal temperature. The patterning film thus formed can be suitably used for a high precision liquid crystal, a black matrix material for organic EL, a light shielding material for an image sensor, a light shielding material for an optical element, a light shielding filter, an IR cut filter, and the like.

EXAMPLES

Next, Examples of the present invention will be explained in detail together with Comparative Examples.

Example 1

To 7.4 g of a monoclinic zirconium dioxide powder having an average primary particle diameter calculated from the specific surface area measured by the BET method of 50 nm were added 7.3 g of metallic magnesium powder having an average primary particle diameter of 100 μm and 3.6 g of magnesium oxide powder having an average primary particle diameter of 20 nm, further 0.04 g of aluminum oxide having an average primary particle diameter of 20 nm is added, and uniformly mixed by a reaction apparatus in which a graphite boat has been internally mounted in a glass tube made of quartz. At this time, an amount of the metallic magnesium added was 98% by mass relative to 100% by mass of the zirconium dioxide, an amount of the magnesium oxide added was 49% by mass relative to 100% by mass of the zirconium dioxide, and an amount of the aluminum oxide added was 0.5% by mass relative to 100% by mass of the zirconium dioxide. The above-mentioned mixture was fired under an atmosphere of the nitrogen gas at a temperature of 700° C. for 60 minutes, thereby practicing a nitrogen reaction of zirconium oxide to obtain a fired product. This fired product was dispersed in 1 liter of water, 17.5% hydrochloric acid was gradually added thereto to carry out washing at a pH of 1 or more while maintaining a temperature to 100° C. or lower followed by adjusting a pH to 7 to 8 with 25% aqueous ammonia, and the mixture was filtered. The filtered solid content was redispersed in water with 400 g/liter, and subjected to acid washing, pH adjustment with aqueous ammonia and filtered once again in the same manner as mentioned above. Thus, after repeating acid washing-pH adjustment by aqueous ammonia twice, the filtrate was dispersed in ion exchange water with 500 g/liter in terms of the solid content, and after subjecting to stirring under heating at 60° C. and adjustment of a pH to 7, the mixture was filtered by a suction filtration apparatus, further washed with an equal amount of ion exchange water, and dried in a hot air dryer at a set temperature of 120° C. to obtain a powder for forming a black light-shielding film comprising zirconium nitride as a main component.

Example 2

0.06 g of aluminum nitride powder having an average primary particle diameter of 100 nm was used instead of aluminum oxide powder. At this time, the addition amount of aluminum nitride was 0.8% by mass relative to 100% by mass of zirconium dioxide. A powder for forming a black light-shielding film comprising zirconium nitride as a main component was obtained in the same manner as in Example 1 except for this.

Comparative Example 1

To 7.4 g of a monoclinic zirconium dioxide powder having an average primary particle diameter calculated from the specific surface area measured by the BET method of 50 nm were added 7.3 g of metallic magnesium powder having an average primary particle diameter of 100 μm and 0.7 g of a magnesium oxide powder having an average primary particle diameter of 20 nm, further 0.04 g of oxide aluminum having an average primary particle diameter of 20 nm is added, and uniformly mixed by a reaction apparatus in which a graphite boat has been internally mounted in a glass tube made of quartz. At this time, an amount of the metallic magnesium added was 98% by mass relative to 100% by mass of the zirconium dioxide, an amount of the magnesium oxide to be added was 10% by mass relative to 100% by mass of the zirconium dioxide, and an amount of the aluminum oxide added was 0.5% by mass relative to 100% by mass of the zirconium dioxide. The above-mentioned mixture was fired under an atmosphere of the nitrogen gas at a temperature of 700° C. for 60 minutes, thereby practicing a nitrogen reaction of zirconium dioxide to obtain a fired product. This fired product was dispersed in 1 liter of water, 17.5% hydrochloric acid was gradually added thereto to carry out washing at a pH of 0.5 or more while maintaining a temperature to 100° C. or lower followed by adjusting a pH to 7 to 8 with 25% aqueous ammonia, and the mixture was filtered. The filtered solid content was redispersed in water with 400 g/liter, and subjected to acid washing, pH adjustment with aqueous ammonia and filtered three times again in the same manner as mentioned above. Thus, after repeating acid washing-pH adjustment by aqueous ammonia twice, the filtrate was dispersed in ion exchange water with 500 g/liter in terms of the solid content, and after subjecting to stirring under heating at 60° C. and adjustment of a pH to 7, the mixture was filtered by a suction filtration apparatus, further washed with an equal amount of ion exchange water, and dried in a hot air dryer at a set temperature of 120° C. to obtain a powder for forming a black light-shielding film of Comparative Example 1 comprising zirconium nitride as a main element.

Examples 3 to 6 and Comparative Examples 2 to 6

With respect to Examples 3 to 6 and Comparative Examples 3 to 6, in the same manner as Example 1, an addition ratio (% by mass) of metallic magnesium powder, magnesium oxide power, aluminum oxide powder and aluminum nitride powder relative to zirconium dioxide, types of reaction gases which are atmospheric gases, a ratio thereof in terms of % by volume, a firing temperature, and a firing time are respectively set, and powders for forming a black light-shielding film were manufactured as shown in Table 1.

kept at a room temperature after being manufactured, (5) OD values when kept for 500 hours under an atmosphere of a high temperature and a high humidity of 85° C. and a relative humidity of 85% after being manufactured. The respective measurement results are shown in Table 2.

(1) Specific surface area: With regard to all the samples, by using a specific surface area measurement apparatus (SA-1100, manufactured by SIBATA SCIENTIFIC TECHNOLOGIES, LTD.), a specific surface area value was measured according to the single point BET method by nitrogen adsorption.

(2) Contents by amount of magnesium and/or aluminum: Contents by amount of magnesium and aluminum were measured by ICP light emission spectrometry measurement (Optima 4300DV manufacture by PerkinElmer Co., Ltd.).

TABLE 1

Production conditions of powder for forming black light-shielding film

| | Metallic Mg/ZrO$_2$ (% by mass) | Mg/ZrO$_2$ (% by mass) | Al$_2$O$_3$/ZrO$_2$ (% by mass) | AlN/ZrO$_2$ (% by mass) | Reaction gas atmosphere (vol % ratio) | Firing temperature (° C.) | Firing time (min) |
|---|---|---|---|---|---|---|---|
| Example 1 | 98 | 49 | 0.5 | — | N$_2$ = 100% | 700 | 60 |
| Example 2 | 98 | 49 | — | 0.8 | N$_2$ = 100% | 700 | 60 |
| Example 3 | 98 | 15 | 0.02 | — | N$_2$ = 100% | 650 | 30 |
| Example 4 | 50 | 500 | 5.0 | — | N$_2$ + H$_2$ = 90%:10% | 650 | 30 |
| Example 5 | 150 | 50 | 0.3 | — | N$_2$ = 100% | 900 | 60 |
| Example 6 | 25 | 15 | 1.5 | — | N$_2$ = 100% | 700 | 60 |
| Comparative Example 1 | 98 | 10 | 0.5 | — | N$_2$ = 100% | 700 | 60 |
| Comparative Example 2 | 98 | 15 | 0.01 | — | N$_2$ = 100% | 700 | 60 |
| Comparative Example 3 | 98 | 15 | 6.0 | — | N$_2$ + H$_2$ = 90%:10% | 700 | 60 |
| Comparative Example 4 | 98 g | 550 | 1.0 | — | N$_2$ = 100% | 700 | 60 |
| Comparative Example 5 | 160 g | 35 | 0.4 | — | N$_2$ = 100% | 950 | 60 |
| Comparative Example 6 | 20 | 49 | 2.2 | — | N$_2$ + H$_2$ = 90%:10% | 650 | 30 |

<Comparative Test and Evaluation 1>

The powders for forming a black light-shielding film of the final products obtained in Examples 1 to 6 and Comparative Examples 1 to 6 were each used as a sample, and by the methods mentioned in detail hereinbelow, (1) a specific surface area, (2) contents by amount of magnesium and/or aluminum, (3) light transmittance in a dispersion at a powder concentration of 50 ppm, and (4) OD values when (3) Spectral curve of dispersion with powder concentration of 50 ppm: With respect to each of the samples of Examples 1 to 6 and Comparative Examples 1 to 6, these samples were separately placed in a circulating horizontal type bead mill (media:zirconia amine-based dispersing agent was added to carry out dispersing treatment in a propylene glycol monomethyl ether acetate (PGM-AC) solvent. The obtained eleven kinds of the dispersions were diluted 100,000-fold and a powder concentration was adjusted to 50 ppm. The light transmittance of each sample of the diluted dispersion was measured in the wavelength range from 240 nm to 1,300 nm using UH-4150 manufactured by Hitachi High-Tech Fielding Corporation, and each of the light transmittance (%) at the wavelength of 370 am near the i-line (365 nm) and at the wavelength of 550 nm was measured.

film, which was kept for 500 hours under an atmosphere of a high temperature and a high humidity at 85° C. and a relative humidity of 85%, were measured in the same manner. The results are shown in Table 2.

As is apparent from Table 2, in Comparative Example 1, pH when washing a fired object was made to be 0.5 which was low, a content of magnesium in a powder for forming

TABLE 2

| | Composition Final analysis of final product | | | Light transmittance with powder concentration of 50 ppm | | OD value at room temperature | | OD value under high temperature and high humidity | |
|---|---|---|---|---|---|---|---|---|---|
| | | | | | | Visible | Near | Visible | Near |
| | product Specific surface area (m$^2$/g) | Mg (% by mass) | Al (% by mass) | Light transmittance (370 nm) | Light transmittance (550 nm) | light transmittance (560 nm) | infrared light shielding ability (650 nm) | light transmittance (560 nm) | infrared light shielding ability (650 nm) |
| Example 1 | 40 | 0.65 | 0.25 | 22.0 | 4.0 | 3.8 | 3.3 | 3.8 | 3.3 |
| Example 2 | 50 | 0.15 | 0.55 | 23.4 | 4.3 | 3.6 | 3.4 | 3.6 | 3.4 |
| Example 3 | 25 | 0.01 | 0.01 | 16.5 | 3.4 | 4.0 | 3.8 | 3.9 | 3.8 |
| Example 4 | 90 | 1.00 | 1.00 | 29.6 | 6.7 | 3.1 | 3.0 | 3.1 | 3.0 |
| Example 5 | 20 | 0.02 | 0.15 | 10.1 | 3.0 | 3.9 | 3.8 | 3.9 | 3.8 |
| Example 6 | 70 | 0.01 | 0.60 | 24.0 | 6.8 | 3.0 | 3.0 | 3.0 | 3.0 |
| Comparative Example 1 | 35 | 0.001 | 0.25 | 21.7 | 3.6 | 3.7 | 3.5 | 3.5 | 3.2 |
| Comparative Example 2 | 30 | 0.02 | 0.002 | 21.9 | 3.5 | 4.1 | 3.6 | 3.6 | 3.1 |
| Comparative Example 3 | 65 | 0.02 | 1.50 | 19.4 | 7.0 | 2.9 | 2.7 | 2.9 | 2.7 |
| Comparative Example 4 | 75 | 1.50 | 0.50 | 30.5 | 8.5 | 2.8 | 2.5 | 2.8 | 2.5 |
| Comparative Example 5 | 19 | 0.40 | 0.20 | 9.0 | 3.1 | 4.2 | 3.8 | 3.8 | 3.5 |
| Comparative Example 6 | 92 | 0.70 | 1.00 | 31.0 | 7.0 | 2.8 | 2.4 | 2.8 | 2.4 |

<Comparative Test and Evaluation 2>

An acrylic resin was added to the dispersion used for the measurement of the light transmittance of the samples obtained in Examples 1 to 6 and Comparative Examples 1 to 6 with a ratio of the black pigment:the resin=6:4 in a mass ratio, and mixed to prepare black photosensitive compositions. The composition was spin-coated onto a glass substrate so that the film thickness after firing became 1 μm, and fired at a temperature of 250° C. for 60 minutes to form a film. The film was kept at a room temperature, and the OD values of visible light (center wavelength: 560 nm and center wavelength: 650 nm) of the film were measured using a densitometer (densitometer) having the product name of X-Rite 361T(V) manufactured by Macbeth Co., based on the above-mentioned equation (2). The OD values of the same a black light-shielding film of the final product was extremely little. As a result, OD values under a high temperature and a high humidity were lowered by 0.2 and 0.3 respectively in central wavelengths of 560 nm and 650 nm compared with values at a room temperature, and the final product was inferior in resistance to weather.

In Comparative Example 2, a content of aluminum in a powder for forming a black light-shielding film of the final product was 0.002% by mass which was too little, so OD values under a high temperature and a high humidity compared with values at a room temperature were lowered by 0.5 in central wavelengths of 560 nm and 650 nm, and the final product was inferior in resistance to weather In Comparative Example 3, a content of aluminum in a powder for forming a black light-shielding film of the final product was 1.50% by mass which was too much, so OD values at a room temperature and OD values under a high temperature and a high humidity were both 2.9 or less, and the final product was inferior in the light-shielding property.

In Comparative Example 4, a content of magnesium in a powder for forming a black light-shielding film of the final product was 1.5% by mass which was too much, so OD values at a room temperature and OD values under a high temperature and a high humidity were both 2.8 or less, and the final product was inferior in the light-shielding property.

In Comparative Example 5, a specific surface area of a powder for forming a black light-shielding film of the final product was 19 m$^2$/g which was too small, so light transmittance at a wavelength of 370 nm in a dispersion with a powder concentration of 50 ppm was 9.0% which was low, and was inferior in light transmittance of an ultraviolet ray.

In Comparative Example 6, a specific surface area of a powder for forming a black light-shielding film of the final product was 92 m$^2$/g which was too large, so light transmittance at a wavelength of 550 nm in a dispersion with a powder concentration of 50 ppm was 7.0% which was high, and was inferior in light transmittance of visible light.

To the contrary, in Examples 1 to 6, specific surface areas of powders for forming a black light-shielding film in the final product were 20 to 90 m$^2$/g, so respective light transmittances at a wavelength of 370 nm and at a wavelength of 550 nm in a dispersion with a powder concentration of 50 ppm were 10.1 to 29.6% and 3.0 to 6.8%, and OD values at a room temperature and OD values under a high temperature and a high humidity were 3.0 or more and the OD values under a high temperature and a high humidity did not change compared with the OD values at a room temperature. From the above results, it was found that the powders for forming a black light-shielding film of the final products of Examples 1 to 6 are advantageous in transmittance of ultraviolet rays, transmittance of a visible light, a light shielding performance, and resistance to weather.

UTILIZABILITY IN INDUSTRY

The powder for forming a black light-shielding film comprising zirconium nitride as a main element of the present invention can be utilized for a high precision liquid crystal, a black matrix material for organic EL, a light shielding material for an image sensor, a light shielding material for an optical element, a light shielding filter, an IR cut filter, and the like.

The invention claimed is:

1. A powder for forming a black light-shielding film having a specific surface area of 20 to 90 m$^2$/g, which is measured by the BET method, comprising a zirconium nitride powder as a main component, and containing magnesium and aluminum, wherein:

the powder for forming the black light-shielding film comprises:

a nano-particulated zirconium nitride particle and, an oxidized film layer or a nitride film layer with aluminum and magnesium generated on a surface layer of the nano-particulated zirconium nitride particle, and the content of the magnesium is 0.01 to 1.0% by mass relative to 100% by mass of the powder for forming the black light-shielding film, and the content of the aluminum is 0.01 to 1.0% by mass relative to 100% by mass of the powder for forming the black light-shielding film.

2. A method for manufacturing the powder for forming a black light-shielding film according to claim 1, the method comprising:

mixing zirconium dioxide powder, metallic magnesium powder, magnesium oxide powder, or both of the magnesium oxide powder and magnesium nitride powder, and aluminum oxide powder or aluminum nitride powder so that the content of the metallic magnesium is 25 to 150% by mass relative to 100% by mass of the zirconium dioxide, the total content of the magnesium oxide and the magnesium nitride is 15 to 500% by mass relative to 100% by mass of the zirconium dioxide, and the content of the aluminum oxide or the aluminum nitride is 0.02 to 5.0% by mass relative to 100% by mass of the zirconium dioxide; and firing the obtained mixed power under an atmosphere of a sole nitrogen gas, under an atmosphere of a mixed gas of a nitrogen gas and a hydrogen gas, under an atmosphere of a mixed gas of a nitrogen gas and an ammonium gas, or under an atmosphere of a mixed gas of a nitrogen gas and an inert gas at a temperature of 650 to 900° C. to reduce the mixed powder.

3. A black photosensitive composition which contains the powder for forming the black light-shielding film according to claim 1 as a black pigment.

4. A black photosensitive composition which contains the powder for forming a black light-shielding film manufactured by the method according to claim 2 as a black pigment.

5. A method for forming a black light-shielding film using the black photosensitive composition according to claim 3.

6. A method for forming a black light-shielding film using the black photosensitive composition according to claim 4.

* * * * *

UNITED STATES PATENT AND TRADEMARK OFFICE
CERTIFICATE OF CORRECTION

PATENT NO. : 11,835,679 B2
APPLICATION NO. : 16/957197
DATED : December 5, 2023
INVENTOR(S) : Takashi Konishi et al.

Page 1 of 1

It is certified that error appears in the above-identified patent and that said Letters Patent is hereby corrected as shown below:

In the Claims

Column 16, Line 32 (Claim 2, Line 16): please change "mixed power" to -- mixed powder --

Signed and Sealed this
Twenty-sixth Day of November, 2024

Katherine Kelly Vidal
*Director of the United States Patent and Trademark Office*